United States Patent [19]

Yoshida et al.

[11] Patent Number: 5,466,665
[45] Date of Patent: Nov. 14, 1995

[54] METHOD OF MANUFACTURING Y-BA-CU-O SUPERCONDUCTING THIN FILM

[75] Inventors: Yukihisa Yoshida; Wataru Ito; Tadataka Morishita, all of Tokyo, Japan

[73] Assignees: Mitsubishi Denki Kabushiki Kaisha; Nippon Steel Corporation; International Superconductivity Technology Center, all of Tokyo, Japan

[21] Appl. No.: 263,957

[22] Filed: Jun. 16, 1994

[30] Foreign Application Priority Data

Jun. 24, 1993 [JP] Japan ................................. 5-153824

[51] Int. Cl.$^6$ ........................... H01L 39/24; C23C 14/34
[52] U.S. Cl. ..................... 505/476; 505/475; 204/192.24; 204/192.13
[58] Field of Search .................... 204/192.15, 192.13, 204/192.24, 298.08; 505/1, 731, 475, 476

[56] References Cited

U.S. PATENT DOCUMENTS

| | | | |
|---|---|---|---|
| 3,461,054 | 8/1969 | Vratny | 204/298.08 X |
| 4,931,169 | 6/1990 | Scherer et al. | 204/298.08 X |
| 5,057,201 | 10/1991 | Fujita et al. | 204/192.24 X |
| 5,180,476 | 1/1993 | Ishibashi et al. | 204/298.08 X |
| 5,225,396 | 7/1993 | Ohtani | 204/192.24 X |
| 5,236,894 | 8/1993 | Tanaka et al. | 204/192.24 X |
| 5,292,417 | 3/1994 | Kugler | 204/298.08 X |
| 5,361,720 | 11/1994 | Evetts et al. | 204/192.24 X |

FOREIGN PATENT DOCUMENTS 0347567 12/1989 European Pat. Off. .
0462906 12/1991 European Pat. Off. .
0587095 3/1994 European Pat. Off. .

OTHER PUBLICATIONS

A. Nakagawa et al., "Substrate Bias and Pressure Effect on Formation of YBaCuO Thin Films in RF Magnetron Sputtering System", *Japanese Journal of Applied Physics*, vol. 30, No. 6A, Jun. 1991, pp. L993–L996.

W. Ito et al., "Effects of Substrate Ion Sheath During Sputtering on the Superconductivity of α-axis YBCO Films", *Physica C*, vol. 224, No. 3–4, pp. 384–390.

W. Ito et al., "Highest Crystallinity of α-axis YBCO Films by DC–94.92 MHz Hybrid Plasma Magnetron Sputtering", *Physica C*, 204, 1993, pp. 295–298.

*Primary Examiner*—Nam Nguyen
*Attorney, Agent, or Firm*—Burns, Doane, Swecker & Mathis

[57] ABSTRACT

A method of manufacturing YBCO superconducting thin films is obtained which is capable of providing superconducting thin films having excellent crystallinity in a high yield by introducing a new film formation parameter in a hybrid plasma sputtering method. When a Y—Ba—Cu—O type superconducting thin film is formed by using a parallel plate sputtering method, a high-frequency voltage generated by a high-frequency power source is superimposed on a DC voltage generated by a DC power source and applied to the cathode electrode at the same time, an electrically conductive YBCO target is placed on the cathode, and the film formation conditions are controlled on the basis of the difference between the voltage drops in each ion sheath formed on the substrate and directly on the target by applying a DC voltage to a substrate holder from the DC power source.

11 Claims, 7 Drawing Sheets

PARTICLES

500mm

500mm

METHOD OF MANUFACTURING Y-BA-CU-O SUPERCONDUCTING THIN FILM

BACKGROUND OF THE INVENTION

Field Of The Invention

The present invention relates to a method of manufacturing Y—Ba—Cu—O (hereinafter referred to as YBCO) superconducting thin films having excellent crystallinity using a sputtering phenomenon. More particularly, the present invention relates to a method of optimizing film formation conditions so that the composition ratio of Y:Ba:Cu of a film becomes 1:2:3. The film is suitable for use in the electronics field of sensors, electronic devices or the like using thin films.

Description Of The Related Art

The hybrid plasma sputtering method is available as a parallel plate sputtering method for forming Y—Ba—Cu—O type superconducting thin films on substrates. The characteristic feature of the hybrid plasma sputtering method is that a high-frequency voltage is applied to the cathode electrode being superimposed on a DC voltage supplied through a low-path filter which cuts off the high-frequency voltage, wherein a conductive YBCO target is placed on the cathode and sputtered in a low vacuum. According to this method, YBCO thin films having excellent crystallinity can be obtained (see, for example, W.Ito et al., "Highest Crystallinity of a-axis YBCO films by DC-94.92 MHz Hybrid Plasma Magnetron Sputtering", Physica C 204(1993) pp.295–298).

According to the hybrid plasma sputtering method, when a bias voltage applied from a DC power source is increased at the same time as a high-frequency voltage is applied to the cathode electrode, an electric current increases sharply from a certain voltage, in correspondence with the conductance of a target, and enters into a so-called constant voltage region as shown in FIG. 7. At this time, a DC plasma is superimposed on a high-frequency plasma (hereinafter referred to as a hybrid plasma state). Use of such plasma makes it possible to speed up the film formation while maintaining the advantage of the high-frequency plasma which contributes to crystallinity. FIG. 7 shows the relationship between a bias voltage applied to the cathode and an electric current when a DC voltage and a high-frequency voltage are applied together on a $YBa_2Cu_3$ Ox target having a composition ratio of Y:Ba:Cu of 1:2:3. The target voltage is a voltage in which a negative bias voltage generated by a DC power source is superimposed on the self bias on the cathode side generated by the high-frequency plasma which is caused by a high-frequency voltage applied to a $YBa_2Cu_3Ox$ target. The target current is the electric current which flows when the target voltage is applied.

By optimizing the film formation conditions by using the hybrid plasma sputtering method so that the composition ratio of Y:Ba:Cu of the film becomes 1:2:3, it is possible to manufacture a YBCO thin film whose crystallinity is optimized automatically. An example of the optimized film formation conditions is as follows: the film formation pressure: 475 mTorr, the flow-rate ratio of sputtering gas Ar to reaction gas O2:2:1, the RF output: 60 W, the cathode voltage: –100 V, and the cathode current: 0.5 A.

The cathode voltage is the value of the voltage in the constant voltage region of the characteristic shown in FIG. 7. This voltage is dependent on the conductance, or the resistance of the target. Therefore, the value of the cathode voltage in the constant voltage region depends upon the target used. When, for example, a target having a low conductance is used, a voltage drop at the cathode which is necessary for generating a hybrid plasma increases.

Under the above circumstance, although the optimal film formation conditions for the composition of the film can be obtained, the film has a major problem as to its crystallinity and surface morphology (surface smoothness). The results obtained thus far reveal that, when the cathode voltage in the constant voltage region falls below –100 V by tens of volts, desired crystallinity cannot be obtained even if the composition of the film is optimized by controlling other film formation parameters.

It can be seen from this that the hybrid plasma sputtering method is a method which is sensitive to, and very restricted with regard to, the conductance of a target used. It seems that the method has a problem as a practical film formation method when the yield of the film with respect to the target is considered.

SUMMARY OF THE INVENTION

The present invention solves the above-described problems of the prior art. It is an object of the present invention to provide a method of manufacturing YBCO superconducting thin films having high crystallinity with a high yield by introducing a new film formation parameter in a hybrid plasma sputtering method.

According to the present invention, in the abovedescribed hybrid plasma sputtering method, a DC bias (hereinafter referred to as a substrate bias) applied to a substrate holder is introduced as a new film formation parameter, and the film formation conditions are controlled on the basis of a difference between the voltage drops in each ion sheath formed on the substrate and directly on the target. As a result, it is possible to provide a YBCO thin film having excellent crystallinity in a high yield with respect to the target.

DESCRIPTION OF THE PREFERRED EMBODIMENTS

Preferred embodiments of the present invention will be described below in detail with reference to the accompanying drawings.

First Embodiment

Figure 1:
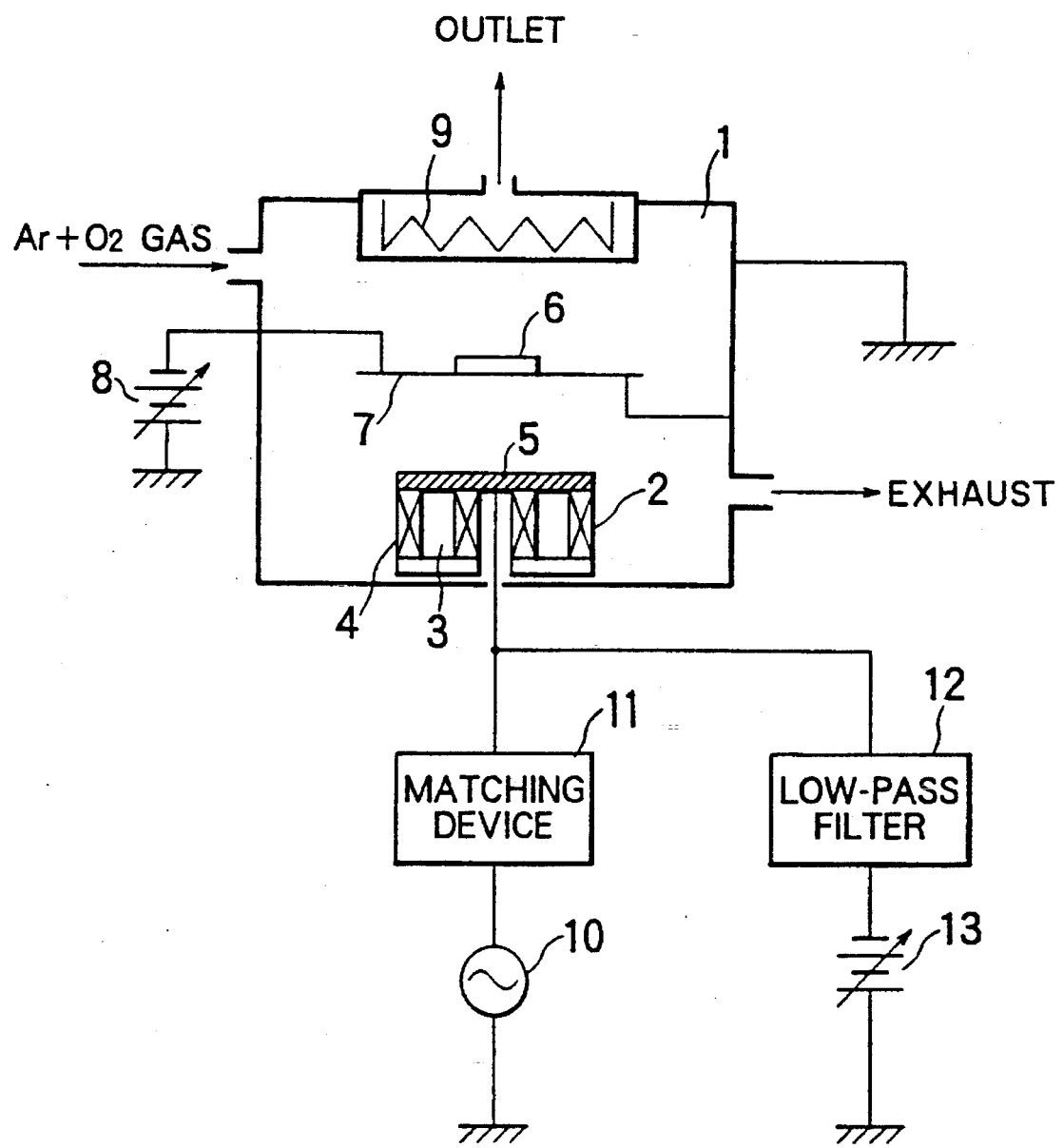
FIG. 1 is a conceptual view illustrating an example of a film formation apparatus in accordance with an embodiment of the present invention.

FIG. 1 is a schematic view illustrating a film formation apparatus according to the present invention. However, the present invention is not limited to this apparatus, and it is possible to modify this apparatus within the scope of the invention.

In FIG. 1, a mixture gas of argon and oxygen is introduced into a film formation chamber 1 evacuated to the order of 1×10$^{-7}$ Torr, and a predetermined pressure is formed by controlling the exhaust speed. A YBCO target 5 having a Y:Ba:Cu composition ratio of 1:2:3 is placed on a cathode 4 in which magnets 2 and cooling water passages 3 are provided, and a substrate 6 is set directly above the YBCO target 5 at a distance of approximately 30 mm therefrom upon a substrate holder 7.

A DC power source 8 is connected to the substrate holder 7, and a positive or negative substrate bias can be applied by switching the terminal of the power source 8. The substrate 6 is heated to a predetermined temperature by a heater 9 on the rear side. A high-frequency (94.92 MHz) power source 10 is connected to the cathode 4 via a matching device 11 so that a high-frequency voltage is applied. At the same time, a negative bias is superimposed on the high-frequency voltage by a DC power source ]3 connected via a low-path filter 12. SrTiO$_3$ and MgO are used for the substrate 6.

To use the substrate bias as a parameter for film formation, it is necessary to examine an influence of the polarity of the substrate bias upon the film. The results of the experiment of the substrate bias under the film formation conditions of the total pressure of 475 mTorr, the argon-oxygen ratio of 1:2, the target voltage of −130 V, the target current of 0.5 Å, and the substrate temperature of 650C. will be explained below.

When, for example, 50 V is applied to the substrate holder 7 from the DC power source 8 as a positive substrate bias, it is observed that the electrical potential of the YBCO target 5 side is increased by a magnitude equal to the bias voltage applied to the substrate 6 side. The composition and crystallinity of the produced film are the same as those which are formed when no bias is applied.

Figure 2:
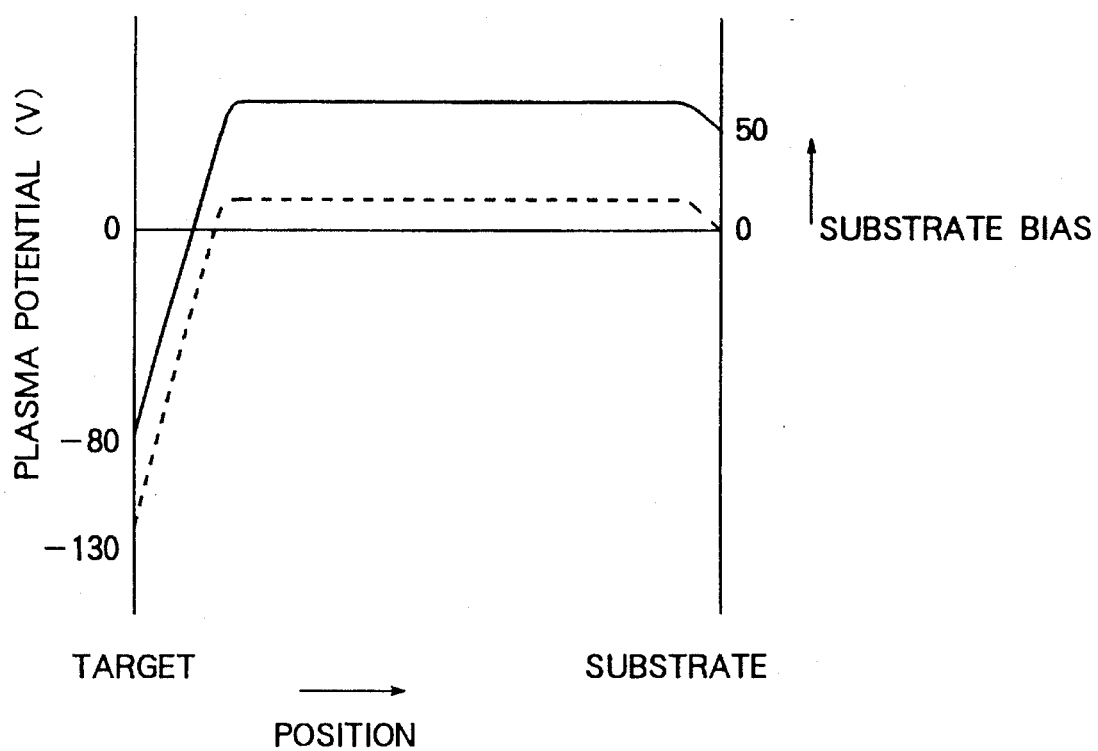
FIG. 2 shows the profile of the plasma potential which is developed when a substrate bias of +50 V is applied to a substrate holder of FIG. 1 in accordance with a first embodiment of the present invention.

It is clear from the above that, as shown in FIG. 2, the positive substrate bias translates upwardly the potential profile of a plasma generated between the substrate 6 and the target 5 and does not exert an influence upon plasma particles hitting on the target 5 or deposition particles which reach the substrate. FIG. 2 shows the profile characteristic of the plasma potential generated when a substrate bias of +50 V is applied. The characteristic of the plasma potential indicated by the dotted line is the characteristic obtained when the DC power source 8 is set at 0 V and the substrate 6 is grounded. The characteristic of the plasma potential indicated by the solid line is the characteristic obtained when a voltage 50 V is applied to the substrate holder 7 by the DC power source 8.

On the other hand, the negative substrate bias showed a substantial effect. Variations in the composition ratio the film produced when the film formation parameters are fixed and only the negative bias value is varied by the DC power source 8 are shown in Table 1.

TABLE 1

| Bias Voltage (V) | Composition Ratio (Y:Ba:Cu) |
|---|---|
| 0 | 1:1.79:2.23 |
| −40 | 1:2.26:2.83 |
| −80 | 1:2.60:4.12 |

When an oxide is used as a target in a parallel plate type sputtering, negative ions of oxygen released from the YBCO target 5 are accelerated by the cathode sheath, causing the substrate 6 to be resputtered and the composition of the film to be varied. This effect is well known. Table 1 shows the results obtained when normalization is made using the yttrium (Y) which is least susceptible to resputtering. As the negative bias was increased, an increase of the composition ratio of Cu/Y was most conspicuous. Given the fact that Cu is more susceptible to resputtering than Ba or Y, it is clear that the negative substrate bias excludes the negative ions of oxygen and has a tendency to decrease the resputtering effect.

Figure 3A:
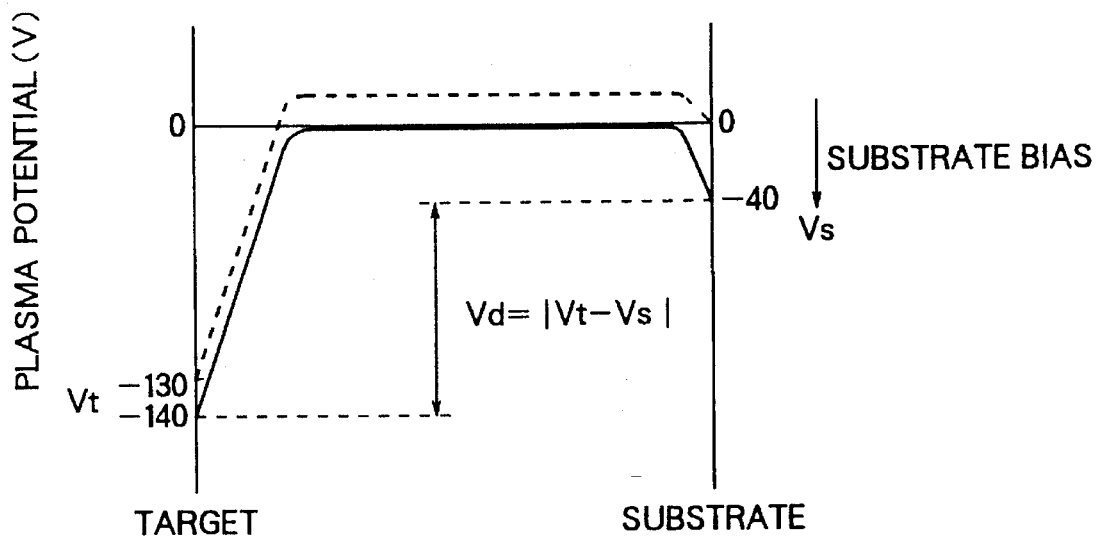
FIGS. 3a and 3b show profiles of the plasma potential which are developed when a negative substrate bias is applied to the substrate holder of FIG. 1 when –40 V and –80 V are applied, respectively, in accordance with the first embodiment of the present invention.
Figure 3B:
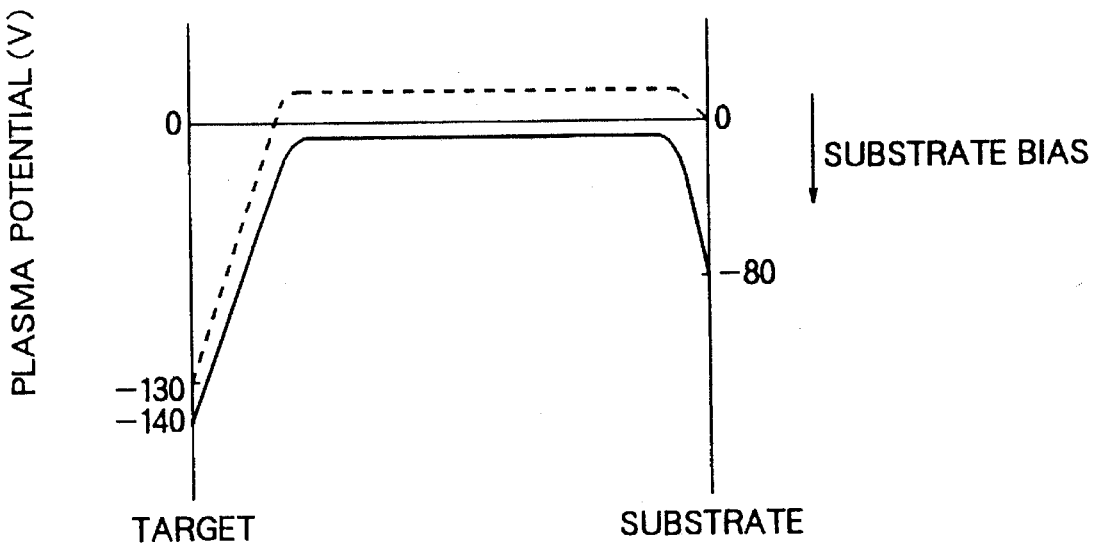

The plasma potential profiles at this time may be presumed to be those of FIGS. 3a and 3b on the basis of the observed electrical potentials of the target 5 and the substrate 6. It can be seen that these potential profiles are in agreement with the results of Table 1. In Table 1, when a bias voltage of −40 V was applied as the substrate bias from the DC power source 8, the potential profile shown in FIG. 3a is formed, and when a bias voltage of −80 V is applied, the potential profile shown in FIG. 3b is formed.

In summary, it is clear that the positive substrate bias does not exert an influence upon film formation, whereas the negative substrate bias can be a film formation parameter which decreases the resputtering effect. In the first embodiment, when the negative substrate bias exceeds 150 V, the sputtering of the substrate 6 by positive ions of argon becomes conspicuous, deteriorating the film. Therefore, the substrate bias is set in a range from 0 to 50 V. If the characteristics of DC plasma are intensified too much in the hybrid plasma sputtering method, it becomes impossible to use the characteristics of the high-frequency plasma. The upper limit of the negative DC voltage applied to the cathode 4 from the DC power source 13 is set at 200 V, and as a result the negative DC current is limited to 1 Å or less.

That is, the method has the advantage that an a-axis orientation film having excellent orientation and crystallinity free from a hetero-phase can be obtained without depending upon a target by a method in which a high-frequency voltage and a DC voltage are superimposed on each other and applied to a cathode electrode at the same time, an electroconductive YBCO target is placed on the target, a DC voltage is applied to a substrate holder so that the film formation conditions are controlled on the basis of a difference between voltage drops in each ion sheath formed on the substrate or directly on the target.

Also, when a film is formed on the basis of a difference between the voltage drops in each ion sheath formed on the substrate or directly on the target, it is possible to always obtain an appropriate voltage drop difference appropriate for the orientation of the film regardless of variations of a voltage drop in the ion sheath formed on the target side by controlling a negative DC voltage applied to the substrate holder in a range from 0 to 150 V. Thus, it is possible to always obtain a YBCO film having stable orientation and crystallinity without being restricted to the target.

Further, it is possible to use the characteristics of the high-frequency plasma while limiting the intensification of the DC plasma characteristics in the hybrid plasma sputtering method by controlling the negative DC voltage superimposed on a self bias on the cathode side generated by high-frequency plasma resulting from the application of the above high-frequency voltage so that the voltage is in the range from 0 to 200 V, making it possible to obtain desired crystallinity.

Second Embodiment

Based on the above-described knowledge, an explanation will be given of the fact that the substrate bias is an effective film formation parameter in the hybrid plasma sputtering method. The details of how problems to be solved are made clear in the hybrid plasma sputtering method will be explained first.

When the target voltage (the same as the cathode voltage) in a hybrid plasma state is denoted as Vt, this voltage is uniquely determined independently of the other film formation parameters, reflecting the conductance of the target 5. That is, Vt varies in accordance with the conductance of the target 5 placed on the cathode 4. When a target with a low conductance is used, the target voltage Vt increases.

To examine the dependence on the target of the physical properties of the film, a comparative film formation experiment was conducted by using two kinds of targets #1 and #2 having different conductances with a view to manufacturing an a-axis orientation YBa2CusOx thin film (the a-axis of the $YBa_2Cu_3Ox$ structure is perpendicular to the substrate).

When the target #1 was used, the target voltage Vt was −100 V, whereas the voltage was −130 V in the target #2. The film formation conditions under which the composition ratio of the film was optimized with respect to each target are listed in Table 2.

TABLE 2

| Target | Film Formation Conditions | | Crystallinity |
| --- | --- | --- | --- |
| | Target Current and Voltage | Total Pressure argon-$O_2$ Ratio | |
| #1 | 0.5 A<br>−100 V | 475 mtorr<br>1:2 | a-axis orientation<br>$\Delta\omega_{200} < 0.05°$ |
| #2 | 0.5 A<br>−130 V | 500 mtorr<br>1:3 | a-axis orientation<br>+4Å phase |

The reason why the total pressure and the argon-$O_2$ ratio differ in Table 2 is that the target voltage $V_t$ of each target is reflected. As stated earlier, the hybrid plasma state is achieved when the target voltage enters a constant voltage region. The difference to be noted between the targets #1 and #2 shown in Table 2 is a voltage value at that time. The target voltage of the target #2 entering the constant voltage region is −130 V, which is greater than that in the case of target #1. This is attributable to the fact that the electrical resistance of the target is greater.

The difference of the film formation conditions for the targets can be explained by the condition of the target voltage. When target #2 having a high target voltage during film formation is used, the acceleration of the negative oxygen ions in the ion sheath formed directly on the target 5 is promoted. To suppress an increase of the resputtering effect as a result of the above acceleration thereof, the film formation pressure becomes higher than that of target #1.

The reason why the electrical resistance of the target is high can be understood when the mixture ratio of argon to oxygen is considered to be attributable to the deficiency of oxygen contained in the target.

The matter to be noted particularly is that the crystallinity or orientation of the film obtained by sputtering two kinds of targets characterized by the above differences of the film formation conditions differs greatly when a target to be sputtered is different in spite of the fact that the composition ratio of Y:Ba:Cu of the film is 1:2:3 for both kinds of targets.

A description will now be given of the physical properties of the film obtained from each target.

When target #1 was used, it was confirmed by an X-ray diffraction method that the crystallinity of the film was optimized automatically by optimizing the composition of the film, and a high-quality a-axis orientation film can be obtained. On the other hand, in the case of target #2, it was confirmed by the same X-ray diffraction method that, as shown in FIGS. 4a and 4b, an a-axis orientation (diffraction space or lattice spacing d=3.90 Å) having a diffraction space considerably greater than that of the bulk is exhibited, and a hetero-phase having a diffraction space of 4.090 Å appears along a vertical direction.

Figure 4A:
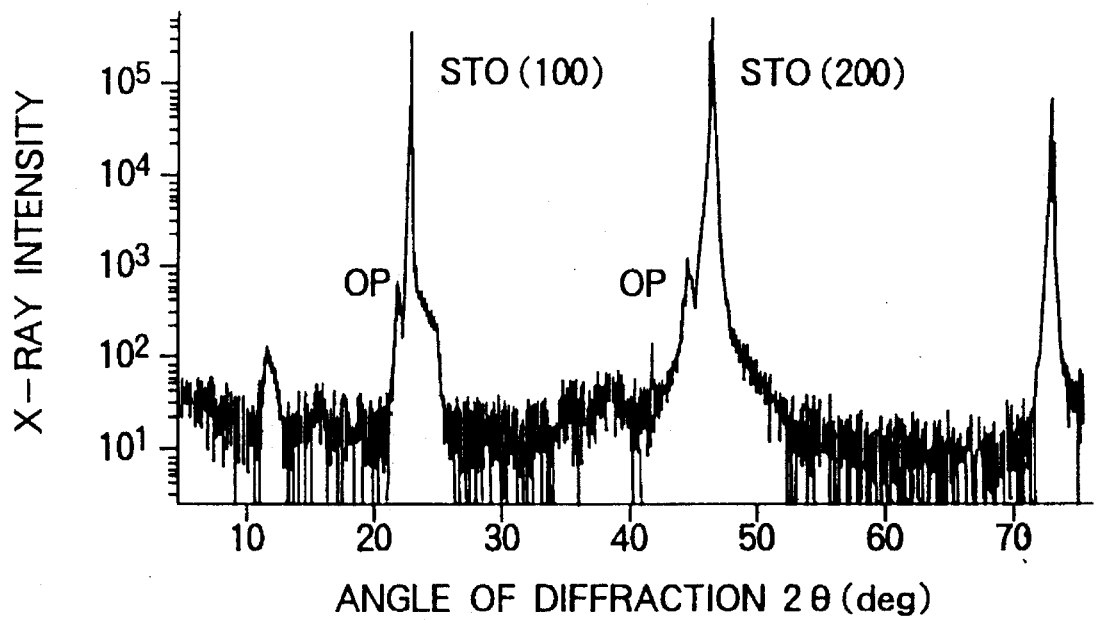
FIGS. 4a and 4b show the X-ray intensity patterns obtained according to an X-ray diffraction method with regard to a YBCO thin film on an $SrTiO_3$ substrate and an MgO substrate, respectively, which thin film is obtained by using a target #2, in accordance with a second embodiment of the present invention.
Figure 4B:
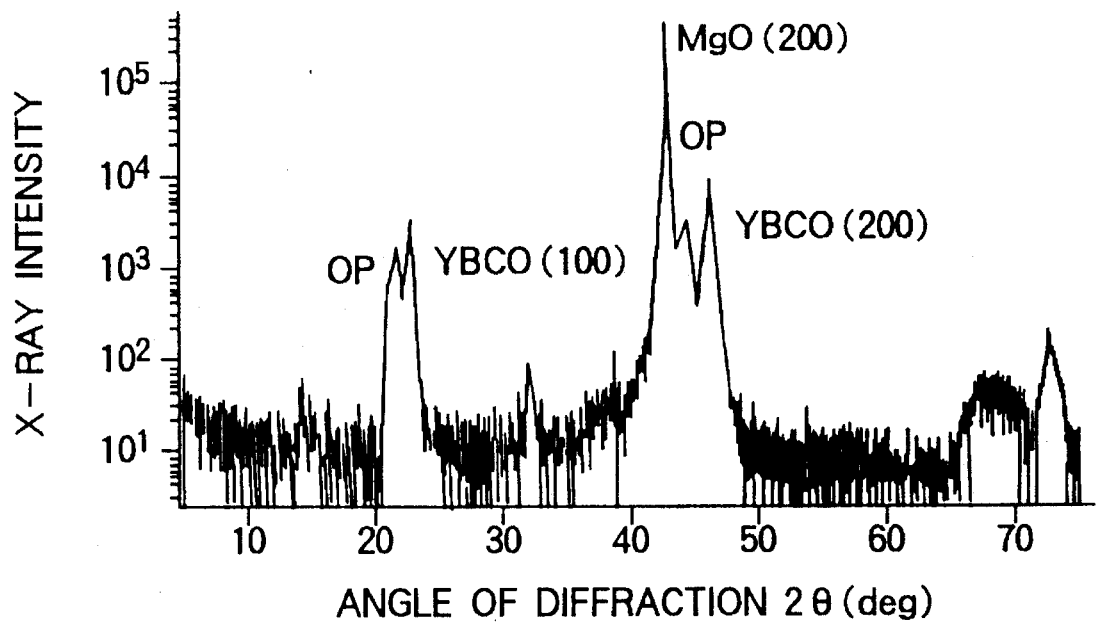

FIGS. 4a and 4b show the crystal orientation patterns, obtained by an X-ray diffraction method, of a YBCO thin film produced on each of an $SrTiO_3$ substrate (represented as STO) and an MgO substrate using target #2. Along the horizontal axis is plotted the angle of diffraction, and along the vertical axis is plotted the X-ray intensity. FIG. 4a shows the crystal orientation pattern on the $SrTiO_3$ substrate, and FIG. 4b shows a crystal orientation pattern on the MgO substrate. Since the peaks of the crystal orientation pattern (n00) of the film on the $SrTiO_3$ substrate overlap with those of the substrate and hence cannot be confirmed, the results on the MgO substrate are also shown in FIG. 4b in a corresponding manner. The peaks corresponding to the hereto-phase are indicated by OP.

The method of calculating the a-axis length (the lattice or diffraction space) of YBCO on the MgO substrate will be explained briefly using FIG. 4b as an example. The Bragg's equation is the basic equation of the X-ray diffraction method: $2d \sin\theta = n\lambda$, where d is the diffraction space, θ is the angle of diffraction, n is the Bragg's reflection order, and λ is the wavelength of X rays. Substituting of 11.38° for the angle of diffraction θ on the basis of the value of 2θ=22.76° of the peak of the crystal orientation pattern (100) of YBCO in FIG. 4b, unity 1 or the Bragg's reflection order n, and the wavelength 1.5405 Å of $k_{\alpha 1}$ of Cu for the X-ray, the diffraction space d=3.90 Å t is obtained.

Figure 5A:
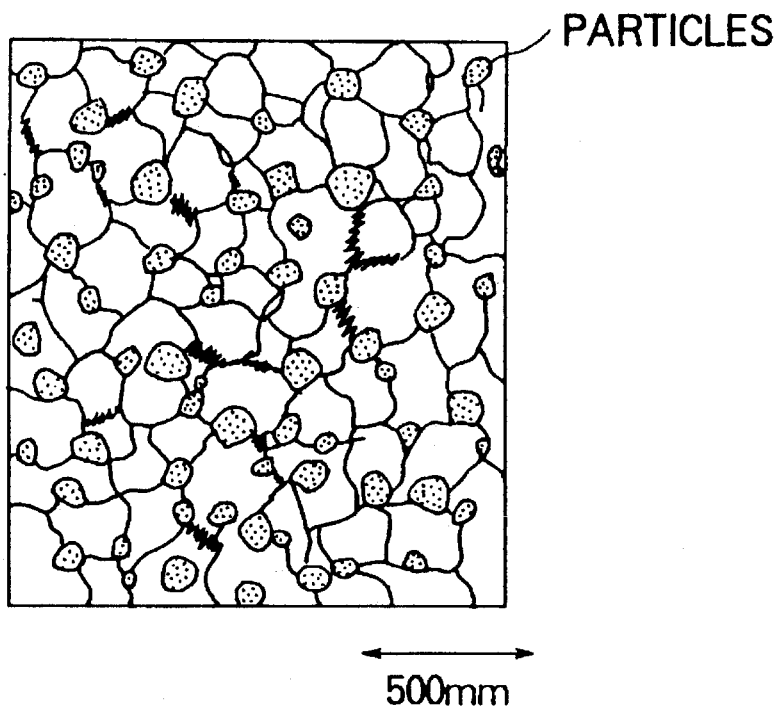
FIGS. 5a and 5b show the surface morphology obtained by observing with a high-resolution scanning electron microscope, illustrating the structure of the film of FIG. 4a and that of FIG. 6a, respectively, in accordance with the second embodiment of the present invention.
Figure 5B:
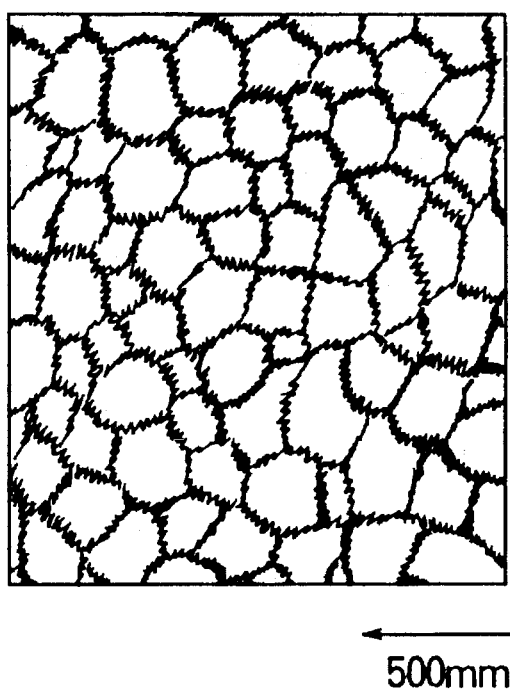

When the surface morphology was observed with a high-resolution scanning electron microscope, particles which appear to cause the hereto-phase were confirmed (see FIG. 5a). It can be seen that a desired a-axis orientation film cannot be obtained with target #2. FIG. 5a is a schematic view illustrating the structure of the film of FIG. 4a, and FIG. 5b is a schematic view illustrating the structure of the film of FIG. 4b.

On the basis of the above results, our ideal target is target #1, and target #2 is an inappropriate target. However, it is not possible to always obtain a target such as target #1. Whether the target is appropriate or not can be known when it is disposed in the cathode 4 and a plasma is generated. Therefore, when a great amount of time required to replace a target and a yield of targets are considered, the hybrid plasma sputtering method has problems as a practical film formation method when applied to manufacturing devices.

According to the second embodiment, however, a new important parameter for film formation was found when a substrate bias experiment was carried out using target #2 in order to solve the above problems.

The conclusion will be described first. It was found that an a-axis orientation film free from a hereto-phase can be obtained from target #2 in the same manner as when target #1 is used by applying a substrate bias of −40 V from the DC power source 8. The film formation conditions under the circumstance are: the total pressure of 475 mTorr, the composition ratio of Ar and $O_2$ gas of 1:3, the target current of 0.5 Å, and the target voltage of −140 V.

Figure 6A:
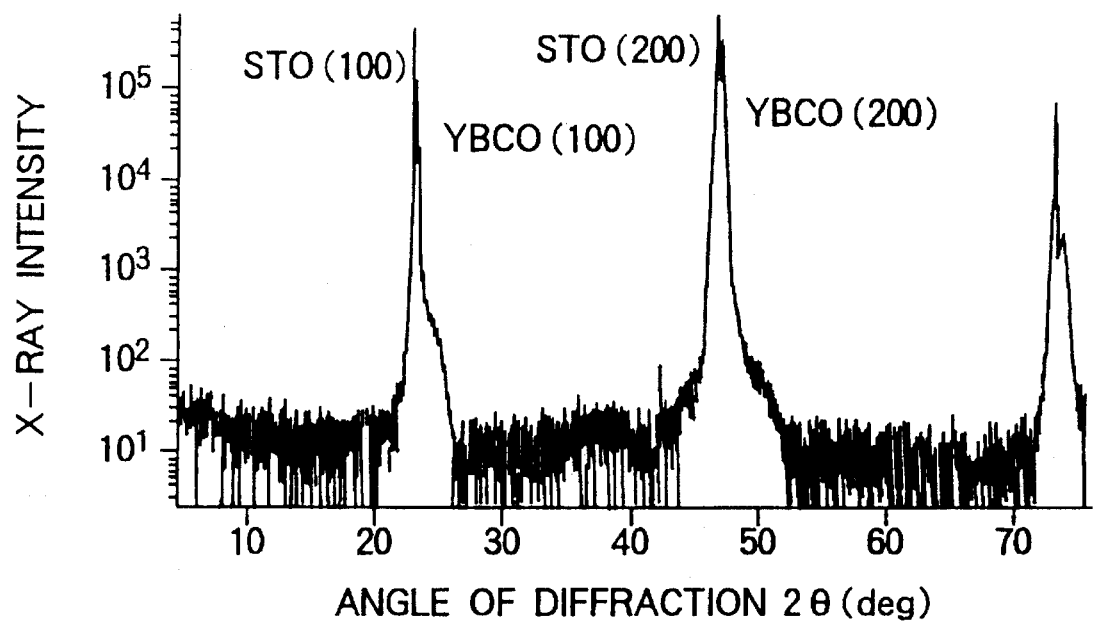
FIG. 6a shows an X-ray intensity pattern according to an X-ray diffraction method of a YBCO thin film obtained by using a target #2 and applying a substrate bias of –40 V in accordance with the second embodiment of the present invention.
Figure 6B:
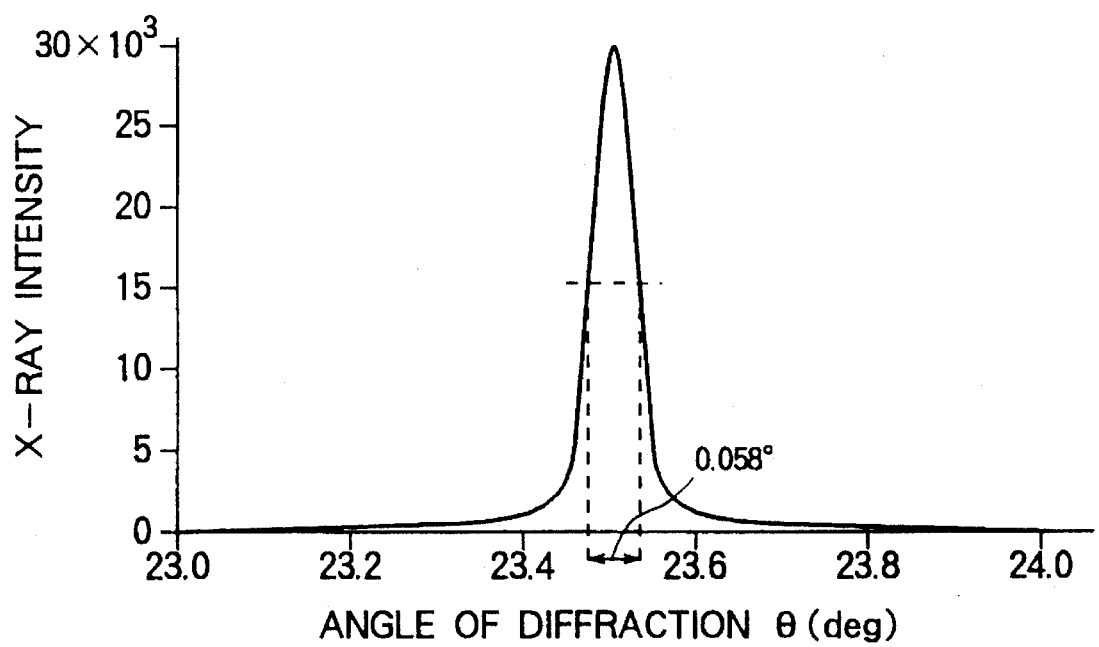
FIG. 6b shows a rocking curve of a peak of a crystal orientation pattern (200) of the film in accordance with the second embodiment of the present invention.
Figure 7:
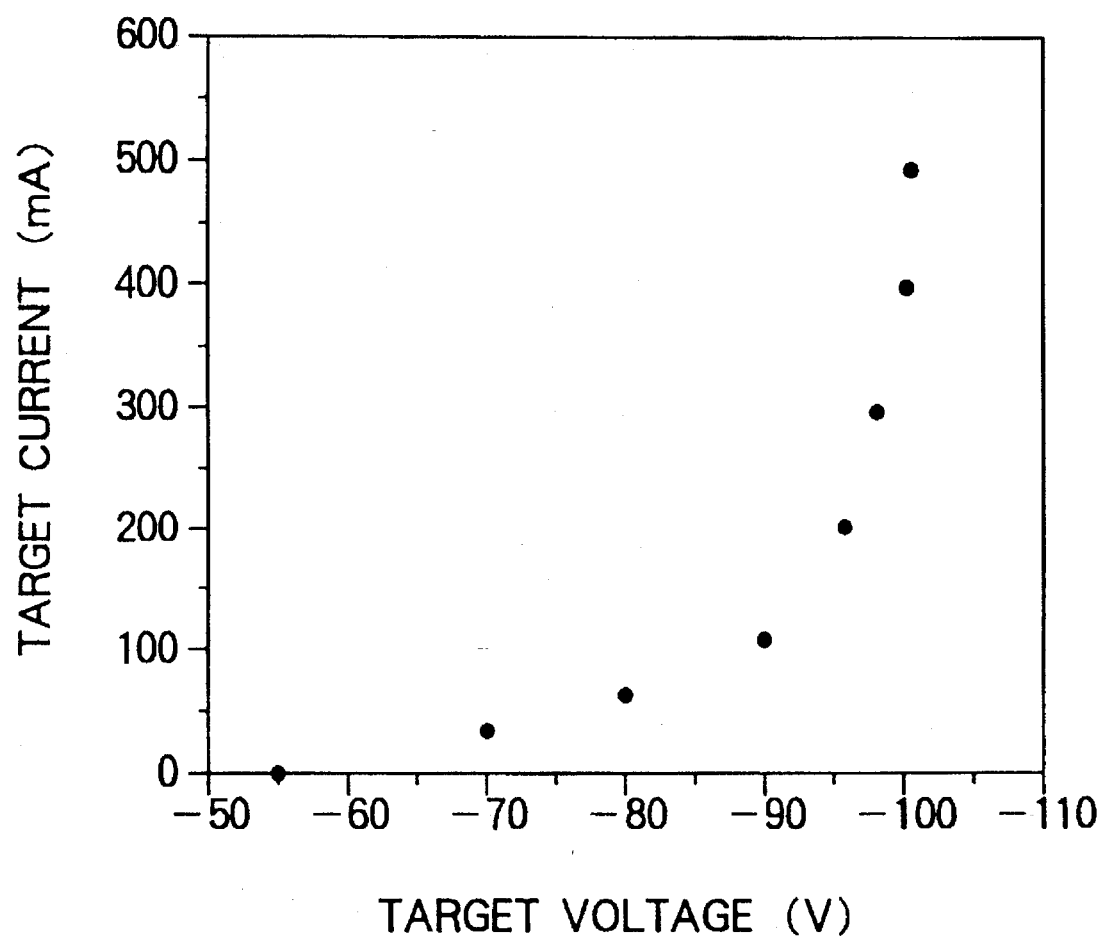
FIG. 7 shows the relationship between the bias voltage applied to a cathode and the target current obtained when a DC voltage is applied together with a high-frequency voltage upon a YBa$_2$Cu$_3$Ox target.

The results of the orientation and crystallinity evaluation of the obtained film by an X-ray diffraction method are shown in FIGS. 6a and 6b. FIG. 6a shows the X-ray intensity pattern obtained by an X-ray diffraction method with respect to a YBCO thin film using a target #2 and applying a substrate bias of −40 V, and FIG. 6b shows a rocking curve of the peak of a crystal orientation pattern (200) of the film.

As can be understood from FIG. 6b, the half-value width of the rocking curve of the peak of the crystal orientation pattern (200) reflecting the crystallinity of the film is recovered to 0.058°, and the surface morphology was improved to one having no particles as can be seen in FIG. 5b.

The effect of the substrate bias of −40 V will now be discussed, and the gist of the second embodiment is made clear.

Voltage drops in the ion sheaths formed directly above the cathode 4 (on the target 5 side) and the anode (on the substrate 6 side) are denoted as $V_t$ and $V_s$, respectively, and the difference between them, $V_d$ ($=|V_t-V_s|$), is considered. Since the anode is grounded when target #1 is used, $V_d$ is 100 V ($V_t=-100$ V, $V_s=0$ V). Where, on the other hand, when target #2 is used, $V_d$ is 130 V where the anode is grounded. When a substrate bias of −40 V is applied, $V_d$ is 100 V ($V_t=-140$ V, $V_s=-40$ V) as can be seen in FIG. 3a.

Not only the negative oxygen ions but also metallic ions, which serve as the deposition seeds, are accelerated in the ion sheaths within which the voltage drop is confined in the plasma. These ions obtain energy necessary for migration on the substrate during this acceleration step, and this energy must be at an appropriate level with respect to the physical properties of the thin film to be manufactured. When this fact and the above-described experimental fact that an a-axis orientation film can be obtained with $V_d=100$ V are considered, the condition $V_d=100$ V is a necessary condition for obtaining an a-axis orientation film having excellent crystallinity free from a hereto-phase. The condition Vd=100 V can be achieved by introducing a substrate bias without depending upon the target 5.

Although the second embodiment describes the a-axis orientation film, this embodiment may be applied to manufacturing a film having other orientations, for example, c-axis orientation films. Since, as described above, the value of $V_t$ varies depending upon the target, it is necessary for the substrate bias applied to obtain $V_d$ appropriate for the orientation of the film to be variable. However, when the negative substrate bias exceeds 150 V, sputtering on the side of the substrate by positive argon ions becomes marked, deteriorating the film. Therefore, the substrate bias should be from 0 to 150 V.

In the hybrid plasma sputtering method, when the DC plasma characteristics are intensified too much, the characteristics of a high-frequency plasma cannot be utilized. Therefore, the upper limit of a negative DC voltage applied to the cathode 4 is set at 200 V, and in correspondence with this, the negative DC current is limited to 1 Å or less.

When a sputtering pressure is 200 mTorr or less, it is impossible to stop the negative oxygen ions from reaching the substrate even by the substrate bias, causing the film to be resputtered. When the sputtering pressure exceeds 2 Torr, the deposition seed sputtered from the target receives thermal stirring to a greater extent during migration, and it cannot reach the substrate. Therefore, the sputtering pressure should preferably be set at from 200 mTorr to 2 Torr.

The substrate temperature during film formation is an important film formation parameter for YBCO crystallization in the same manner as in other film formation methods. When the substrate temperature is 600° C. or less, the YBCO structure is not formed. When the substrate temperature is 900° C. or more, the surface morphology is considerably deteriorated due to redeposition or the like. Therefore, the substrate bias is set at from 600° C. to 900° C.

In the hybrid plasma sputtering method, the intensification of the DC plasma characteristics are limited by limiting a DC current to be superimposed on a self bias on the cathode side, generated by a high-frequency plasma caused by the application of a high-frequency voltage, in the range of more than 0 mA to 1 A or less. Thus, it is possible to use the high-frequency plasma characteristics and obtain desired crystallinity.

Also, it is possible to prevent the film from being resputtered by blocking the negative oxygen ions from reaching the substrate by forming a film under the condition of the sputtering pressure of 200 mTorr to 2 Torr. Another advantage is that it is possible for the deposition seed to easily reach the substrate sputtered from the target without receiving the thermal stirring during migration.

Further, YBCO crystallization is made possible while securing a substrate temperature necessary for forming a YBCO structure without deteriorating the surface morphology by forming a film in a temperature range of 600° C. to 900° C.

As described above, it is difficult in the hybrid plasma sputtering method to always manufacture a YBCO thin film having required orientation and crystallinity stably by only controlling film formation parameters as in the past because limitations imposed by the target used are stringent. In other words, the hybrid plasma sputtering method has the problem that the yield of the film with respect to the target is poor. However, according to the above embodiment, the above-described problems are solved by introducing a substrate bias and controlling a new film formation parameter of Vd, which is a difference between the voltage drops in the ion sheaths formed on the substrate and directly on each target. Thus, the method seems to contribute to research into improvements of superconducting characteristics of a thin film and applications thereof into devices in the future.

What is claimed is:

1. A method of manufacturing Y—Ba—Cu—O superconducting thin film on a substrate by using a parallel plate sputtering method comprising the steps of:

placing an electrically conductive YBCO target on a cathode electrode inside a film formation chamber in a low vacuum and placing said substrate directly above said target via a substrate holder;

superimposing a high-frequency voltage on a negative DC voltage and applying them on said cathode electrode;

applying a negative DC voltage on said substrate holder; and controlling film formation conditions on the basis of a difference between voltage drop across an ion sheath formed at said substrate and across an ion sheath formed directly above the YBCO target.

2. A method according to claim 1 wherein the negative DC voltage which is controlled as one of said film formation conditions and applied to said substrate holder is in a range exceeding 0 and up to 150 V.

3. A method according to claim 1 wherein said negative DC voltage which is controlled as one of said film formation conditions and superimposed on a self bias of the cathode electrode, generated by a high-frequency plasma caused by said application of said high-frequency voltage, is in a range exceeding 0 and up to 200 V.

4. A method according to claim 1 wherein a DC current which is controlled as one of said film formation conditions and superimposed on a self bias of said cathode electrode, generated by a high-frequency plasma caused by said application of said high-frequency voltage, is in a range exceeding 0 mA and up to 1 A.

5. A method according to claim 1 wherein a sputtering pressure which is controlled as one of said film formation conditions is in a range of from 200 mTorr to 2 Torr.

6. A method according to claim 1 wherein a temperature which is controlled as one of said film formation conditions and at which said substrate is heated is in a range of from 600° C. to 900° C.

7. A method according to claim 1 wherein a hybrid plasma obtained by superimposing a DC plasma generated by applying a negative DC voltage on a high-frequency plasma generated by applying said high-frequency voltage is used to form a film.

8. A method according to claim 1 wherein said YBCO target is a $YBa_2Cu_3Ox$ target in which a composition ratio of Y:Ba:Cu is adjusted to 1:2:3.

9. A method according to claim 1 wherein said substrate is made of a compound selected from the group consisting of $SrTiO_3$ and MgO.

10. A method according to claim 1 wherein a mixture gas of argon and oxygen is introduced into said film formation chamber.

11. A method according to claim 1 wherein said difference between said voltage drops across said ion sheath formed at said substrate and across said ion sheath formed directly above said YBCO target is controlled to 100 V, thereby obtaining an a-axis orientation film.

\* \* \* \* \*